(12) United States Patent  
Bartram (10) Patent No.: US 8,928,403 B2
(45) Date of Patent: Jan. 6, 2015

(54) ENVELOPE PATH PROCESSING FOR ENVELOPE TRACKING AMPLIFICATION STAGE

(75) Inventor: Ben Bartram, Cambourne (GB)

(73) Assignee: Nujira Limited (GB)

( * ) Notice: Subject to any disclaimer, the term of this patent is extended or adjusted under 35 U.S.C. 154(b) by 112 days.

(21) Appl. No.: 13/435,764

(22) Filed: Mar. 30, 2012

(65) Prior Publication Data

US 2012/0249238 A1 Oct. 4, 2012

(30) Foreign Application Priority Data

Mar. 31, 2011 (GB) .................................. 1105462.4

(51) Int. Cl.
*H03G 3/20* (2006.01)
*H03F 3/04* (2006.01)

(52) U.S. Cl.
USPC ............................ 330/136; 330/296; 330/297

(58) Field of Classification Search
USPC ......................................... 330/136, 296, 297
IPC ..................................... H03G 3/20; H03F 3/04
See application file for complete search history.

(56) References Cited

U.S. PATENT DOCUMENTS

| 5,404,113 | A | * | 4/1995 | Nitardy ............................ 330/10 |
| 6,256,482 | B1 | * | 7/2001 | Raab .............................. 455/108 |
| 6,600,369 | B2 | * | 7/2003 | Mitzlaff ........................ 330/149 |
| 7,447,484 | B2 | | 11/2008 | Ishikawa et al. |
| 7,522,676 | B2 | * | 4/2009 | Matero ......................... 375/295 |
| 7,539,466 | B2 | * | 5/2009 | Tan et al. .................... 455/127.1 |
| 7,653,147 | B2 | | 1/2010 | Palaskas et al. |
| 7,715,811 | B2 | * | 5/2010 | Kenington ................. 455/127.1 |
| 7,881,683 | B2 | | 2/2011 | Hellberg et al. |
| 8,509,715 | B2 | * | 8/2013 | Kanno et al. ............... 455/127.1 |
| 8,605,774 | B2 | * | 12/2013 | Rupp et al. .................... 375/224 |
| 2009/0097591 | A1 | | 4/2009 | Kim |

OTHER PUBLICATIONS

Sylvan, K., "GB Application No. 1105462.4 Search Report Jul. 29, 2011", , Publisher: UK IPO, Published in: GB.

* cited by examiner

*Primary Examiner* — Patricia Nguyen
(74) *Attorney, Agent, or Firm* — Kaplan Breyer Schwarz & Ottesen, LLP (57) ABSTRACT

The invention relates to a method of calibrating an envelope path and an input path of an amplification stage of an envelope tracking power supply, the method comprising matching the envelope path to at least one characteristic of at least one element of the input path.

18 Claims, 8 Drawing Sheets

ENVELOPE PATH PROCESSING FOR ENVELOPE TRACKING AMPLIFICATION STAGE

CROSS-REFERENCE TO RELATED APPLICATIONS

Patent application GB 1105462.4, filed Mar. 31, 2011, is incorporated herein by reference.

FIELD OF THE INVENTION

The present invention relates to an amplification stage in which an envelope tracking (ET) modulator is utilised to provide a power supply to an RF amplifier.

DESCRIPTION OF THE RELATED ART

Figure 1:
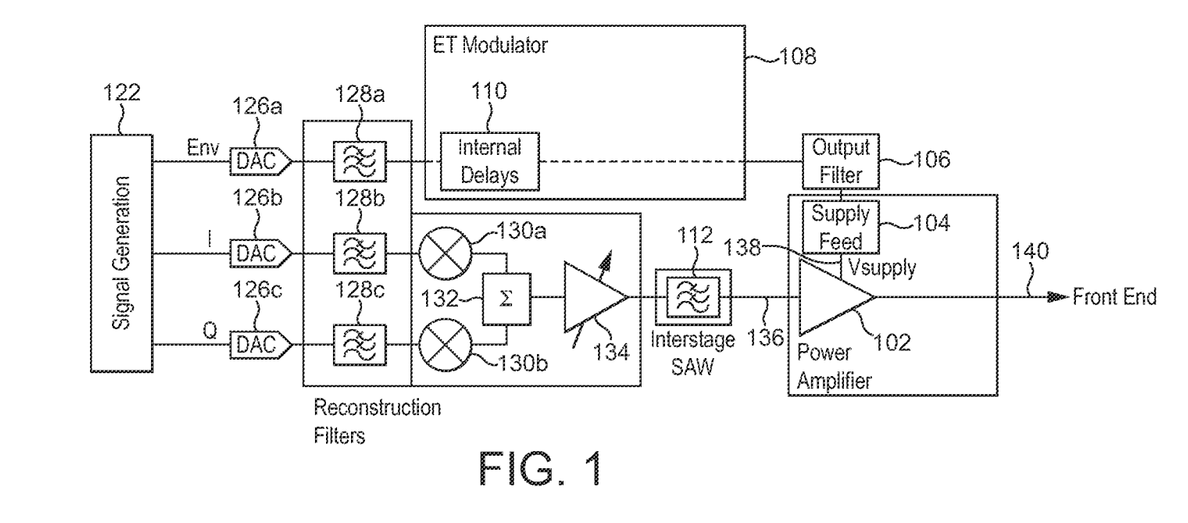
FIG. 1 illustrates an RF amplification stage as known in the art.

With reference to FIG. 1 there is illustrated components of a known RF amplification architecture in which an envelope tracking (ET) modulator is used to provide a power supply to a radio frequency (RF) power amplifier.

As illustrated in FIG. 1, an RF power amplifier 102 receives an RF input signal to be amplified on an input line 136, and receives a modulated power supply voltage $V_{supply}$ on line 138. The RF power amplifier 102 generates an RF output signal on line 140. An example implementation of such an RF power amplifier is in mobile communication systems, with the RF output on line 140 connected to the front end of radio transmission equipment.

As illustrated in FIG. 1, an envelope signal representing the envelope of the RF input signal to be amplified is converted by a digital-to-analogue converter 126a into an analogue signal, filtered by an optional envelope filter 128a, and then provided as an input to an ET modulator 108. The output of the ET modulator 108 forms an input to an output filter 106, and a modulated supply voltage is then provided through a supply feed 104 to provide the supply voltage on line 138.

Baseband I and Q signals are converted into analogue signals via respective digital-to-analogue converters 126b and 126c, and optionally filtered through respective I and Q filters 128b and 128c. The filtered I and Q signals are provided as inputs to a vector modulator, represented by respective multipliers 130a and 130b and a combiner 132. The combined output of the combiner 132 forms an input to a variable gain amplifier 134, the output of which forms an input to an optional interstage surface acoustic wave (SAW) filter 112. The output of the filter 112 provides the RF input signal to be amplified on input line 136 to the RF power amplifier 102.

The generation of the envelope signal and the I and Q baseband signals is known to one skilled in the art. Various techniques for the generation of such signals may be implemented. A signal generator 122 is illustrated in FIG. 1 for generating the I and Q signals and the envelope signal.

As known in the art, the main signal path of an amplification stage such as illustrated in FIG. 1 has frequency dependent components which apply dispersive and amplitude effects to the signals in that path. These effects adversely impact on the ability of the system to meet certain spectral emission requirements and maximise operating efficiency, as the signals in the envelope path prior to magnitude calculation must match those in the RF path accurately and precisely.

In the prior art it is known to apply delays in either the input path or the envelope path in order to align the signals in these paths. Once determined, the delays are fixed for a given operating condition. Such fixed delays based on an approximation of the actual delays in the paths may be sufficient to achieve a given efficiency target, but may not be sufficient to adequately reduce the spectral distortion. Reducing spectral distortion is important for many systems, as spectral emission specifications must be met for many systems as part of a regulatory requirement.

A further disadvantage with prior art techniques is that a simple delay element does not account for any amplitude variation.

It is an aim of the present invention to provide an improved technique for controlling the RF and envelope paths.

SUMMARY OF THE INVENTION

The invention provides a method of calibrating an envelope path and an input path of an amplification stage of an envelope tracking power supply, the method comprising matching the envelope path to at least one characteristic of at least one element of the input path.

The input path may be defined as a path along which a signal is delivered to a signal input of an amplifier of the amplification stage. The envelope path may be defined as a path along which a signal is delivered to a power supply input of the amplifier. The envelope path may include an envelope detector for generating a signal representing the envelope of a signal to be amplified. The envelope path may include a modulator for generating a voltage supply for the amplifier.

The step of matching the envelope path to at least one characteristic of at least one element of the input path may comprise providing, in the envelope path, a replica of the at least one element.

The input path may include a Q signal channel and an I signal channel, the step of matching comprising matching the envelope path to at least one characteristic of at least one element of the Q signal channel and matching the envelope path to at least one characteristic of at least one element of the I signal channel. The method may further comprise providing, in the envelope path, a replica of at least one element of the Q signal channel and a replica of at least one element of the I signal channel.

The at least one characteristic may include a delay characteristic.

The step of matching may comprise matching, in the envelope path, a delay characteristic of the Q signal channel and the I signal channel. The delay characteristic is the relative delay between the Q signal channel and the I signal channel. The method may further comprise: (a) applying a calibration signal to the Q signal path; applying a constant amplitude signal to the I signal path; detecting a signal at the output of the amplifier; correlating the detected signal and the calibration signal; and determining a delay in the Q signal path in dependence on the correlation; (b) applying a calibration signal to the I signal path; applying a constant amplitude signal to the Q signal path; detecting a signal at the output of the amplifier; correlating the detected signal and the calibration signal; and determining a delay in the I signal path in dependence on the correlation; (c) determining the difference between the Q and I signal path delays; (d) applying a delay in the envelope path corresponding to the determined difference to reduce the difference between the timing of the input path and envelope path.

The set of steps (a) may be performed before or after the set of steps (b).

The calibration signal may be a sinusoidal signal, and delay in either the Q signal path or the I signal path is determined by measurement of a phase difference between the detected output signal and the sinusoidal calibration signal.

The characteristics of the input path may be applied in the envelope path before generation of the envelope signal.

The invention further provides an amplification stage including an amplifier and an envelope tracking power supply having an input path and an envelope path, the amplification stage further including a signal processor in the envelope path adapted to match at least one characteristic of at least one element of the input path.

The signal processor may be adapted to provide a replica of the at least one element.

The input path may include a Q signal channel and an I signal channel, the signal processor including a first processing stage for matching the envelope path to a characteristic of the Q signal channel and a second processing stage for matching the envelope path to a characteristic of the I signal channel.

The first processing stage may be adapted to provide a replica of the Q signal channel and the second processing stage is adapted to provide a replica of the I signal channel. One of the first or second processing stages may be adjusted in dependence on a determination of a relative difference between the I signal channel and the Q signal channel.

The amplification stage may further include an envelope detector for generating an envelope signal for the envelope path, the input to the envelope detector being provided by the signal processor.

The characteristic may be an impairment of at least one element of the input path.

The amplification stage may be an RF amplification stage.

BRIEF DESCRIPTION OF THE FIGURES

The invention will now be described by way of example with reference to the accompanying Figures in which.

DESCRIPTION OF THE PREFERRED EMBODIMENTS

The invention will now be described with further reference to the exemplary RF amplification architecture of FIG. 2, which represents the RF amplification architecture of FIG. 1 modified in accordance with exemplary embodiments of the invention. The invention, and its embodiments, is not however limited in its applicability to the exemplary architecture and implementation as illustrated in FIG. 2.

Figure 2:
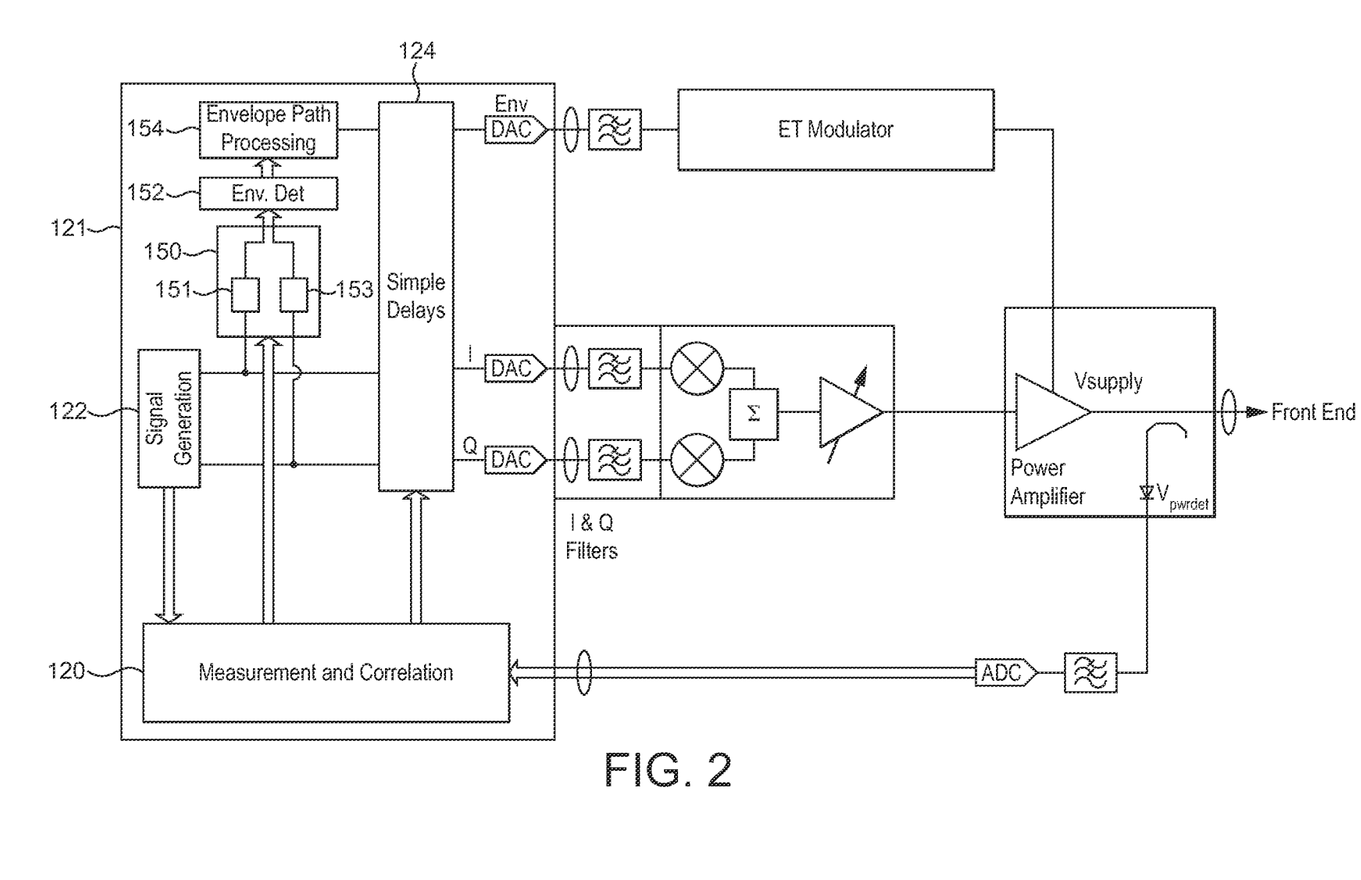
FIG. 2 illustrates an improved RF amplification stage in accordance with an embodiment of the invention.

With further reference to FIG. 2, the RF amplification architecture is adapted in a described embodiment of the invention to include a calibration block 121 including the signal generator 122, a signal processing block 150, an envelope detector 152, a processing block 154, and a delay block 124. The amplification stage is further adapted to include a diode 114 representing in general a power detector, a filter 118 and an analogue to digital converter 116.

In the described embodiment, the signal processing block 150 matches the characteristics of the I and Q filters 126b and 126c of the input path. This signal processing block 150 approximates the frequency response of each of the I and Q filters 126b and 126c.

In general, the signal processing block 150 is arranged to match, in the envelope path, at least one characteristic of at least one element of the input path, and preferably all characteristics of all elements of the input path. The signal processor implements appropriate processing to match a characteristic of at least one element of the input path, so that the signals in the envelope path are subject to the same processing and/or impairments as the signals in the input path. This improves the alignment of the signals in the envelope path with the signals in the input path.

Preferably the signal processing block 150 replicates at least one element of the input path. Preferably at least one characteristic is an impairment of at least one element of the input path.

As shown in FIG. 2, preferably the processing block has first and second processing stages, 151 and 153, or sub-processors, for respectively processing the signals corresponding to the I and Q channels. The outputs of these sub-processing blocks may be combined for further processing to match the combined processing of the input path.

The generation of the envelope signal, in block 152, occurs after the signal processing block 150.

Figure 3:
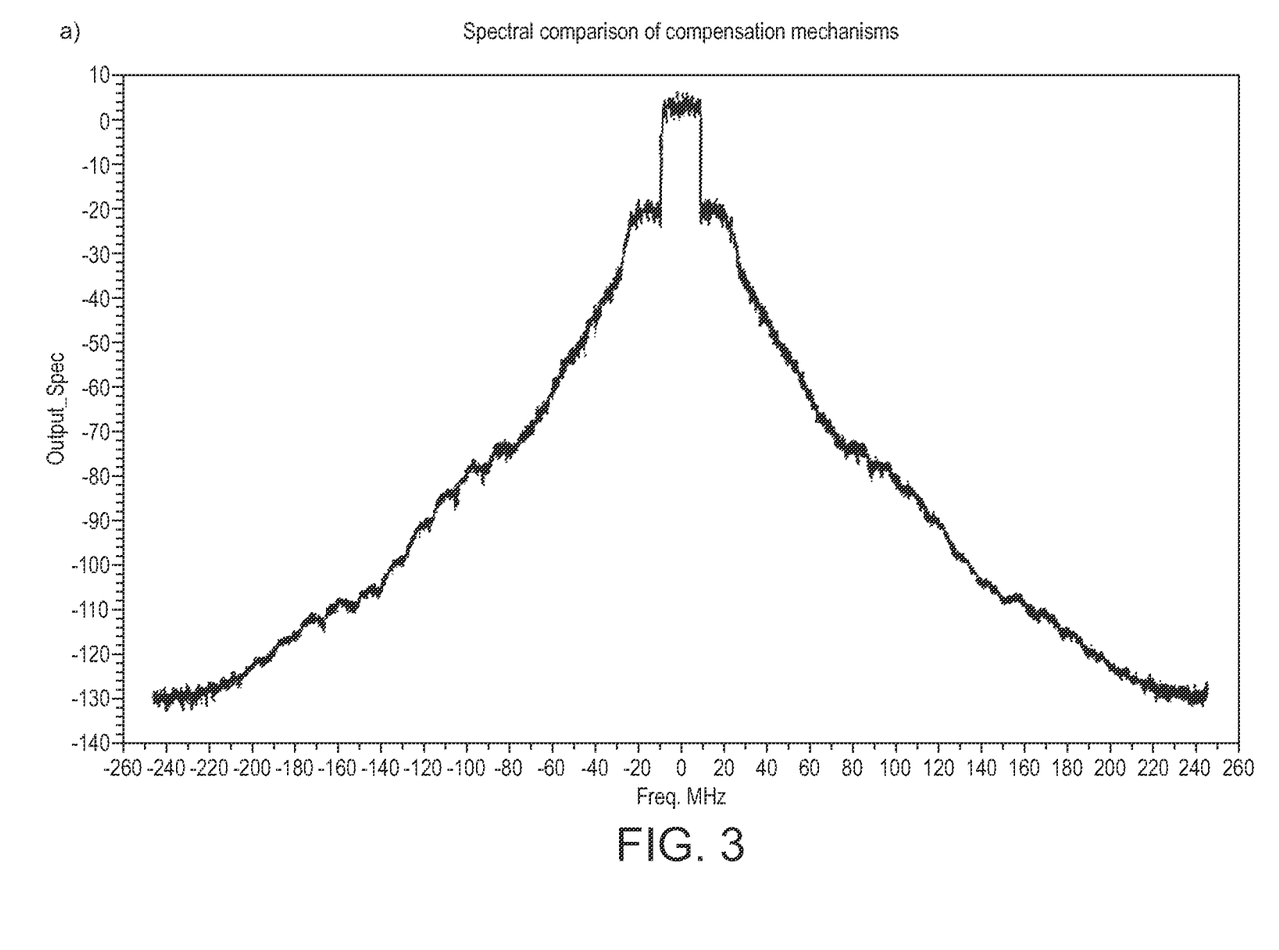
FIG. 3 illustrates plots showing performance comparisons and the advantage achieved by the present invention.

With reference to FIG. 3 there is illustrated plots showing spectral distortion.

FIG. 3(a) shows a plot where no compensation is applied in the input and envelope paths to attempt to align the signals.

FIG. 3(b) shows a plot for an arrangement where delay compensation is applied in accordance with the prior art.

Delay compensation is applied in the delay block 124 for signals in either the input or envelope path. As can be seen, in comparison to FIG. 3(a), an improvement is obtained.

FIG. 3(c) shows a plot where the signal processing block 150 is used in accordance with the invention. As can be seen spectral distortion is notably improved in the results plotted in FIG. 3(c) as compared to the prior art arrangement as plotted in FIG. 3(b).

FIG. 3(d) shows a plot where a signal processing block 150 in accordance with the invention is used in combination with the path delays of the prior art, with the cut-off frequency of the signal processing block 150 set to +5%, i.e. with a reduced accuracy of the signal processing. In this case an improvement over the prior art of FIG. 3(b) is still obtained.

An exemplary implementation of the invention is now described with further reference to FIG. 2.

As illustrated in the arrangement of FIG. 2, the I data signal, and Q data signal for the respective digital-to-analogue converters 126b and 126c are generated by the signal generation block 122, and applied to the respective filters 128b, 128c via the programmable delay adjustment block 124.

The I data signal and Q data signal are provided also as inputs to the envelope path. These signals are provided as inputs to the signal processing block 150, and further blocks 152 and 154 before being applied to the filter 128a via the delay block 124.

The signal generation block 122 further generates signals to the measurement and correlation block 120, and the measurement and correlation block 120 generates signals to the programmable delay adjustment block 124 and the signal processing block 150.

The diode 114 is connected to the output of the power amplifier 102 on line 140 in order to provide the functionality of a power detector. The diode 114 is further connected to the filter 118, which in turn is connected to the analogue-todigital converter 116 to provide a digitised and filtered representation of the signal detected by the diode 114 to the measurement and correlation block 120.

The implementation shown is exemplary, and the invention is not limited to the use of a diode as a power detector to provide feedback to the measurement and correlation block 120. In general, the diode 114 represents a functional block for providing a signal representing the amplitude or power of the signal at the output of the RF power amplifier 102. In an alternative implementation, the detection could be implemented using a receiver chain including an analogue to digital converter, with detection of the envelope being implemented in the digital domain.

The principles of the present invention as exemplified by the arrangement of FIG. 2 are now further described with reference to an exemplary procedure as set out in the flow diagram of FIG. 4.

As denoted in step 202, the signal generation block is adapted to generate the I and Q signals for the main input path.

In a calibration phase of operation, the envelope path is preferably set by the signal generator 122 to operate as a fixed supply at such a level as to ensure that the power amplifier is in a linear operating state for the signals of interest generated for the RF input path, as discussed below.

The signal generation block 122 is arranged to generate a calibration signal with good self-correlation properties. The generation of such a signal will be familiar to one skilled in the art, and falls outside the scope of the present invention. The signal generation block 122 additionally generates a constant amplitude signal.

In a first phase of self-calibration 201, as denoted by step 204 the signal generation block 122 is arranged to apply the generated calibration signal with good self-correlation properties to the Q channel of the main signal path (via the programmable delay adjustment, with no delay applied). The frequency is chosen to be suitable, and applied so as to generate amplitude modulation (AM).

The signal generation block 122 is further arranged, as denoted by step 206, to apply the constant amplitude signal to the I channel of the input path (via the programmable delay adjustment block 124, with no delay applied).

Then in accordance with the standard operation of the power amplification stage, the combined signal of the I and Q channels are processed by the RF input path and amplified by the power amplifier, the power amplifier receiving a fixed supply voltage which is generated in the envelope path in under control of the signal generator.

The diode detector 114, as denoted by step 208, detects the power of the output of the RF amplifier, which is delivered to the measurement and correlation block 122 through the feedback path formed by the diode 114, the filter 118, and the analogue-to-digital converter 116.

The measurement and correlation block 120, as denoted by step 210, correlates the signal representing the detected output power with the originally generated calibration signal applied to the Q channel. In dependence on such correlation a delay value is calculated as denoted by step 212, which represents the delay associated with the Q channel filter 128c. The delay value between the two signals can be determined using known correlation techniques, and the implementation of the correlation function falls outside the scope of the invention.

In a second phase 203 of the self-calibration process, as denoted by step 214 the signal generation block 122 is adapted to apply the calibration signal to the I channel (via the programmable delay adjustment block 124, with the delay being set to zero). The signal generation block 122 is further adapted as denoted by step 216 to apply the constant amplitude signal to the Q channel (via the programmable delay adjustment block 124, with the delay set to zero).

As in the first phase of operation the diode 114 detects the power of the output of the RF amplifier as denoted by step 218, and the detected power is provided to the measurement and correlation block 120.

The measurement and correlation block 120 correlates the signal representing the detected power with the calibration signal as denoted by step 220, utilising a correlation function as used in step 210. The correlation calculates a delay value, as represented by step 222, which represents the delay associated with the I filter 128b.

It should be noted that the first and second phases of the self-calibration process may be carried out in any order, such that the second phase may take place before the first phase.

After completion of the first and second phases of self-correlation, the measurement and correlation block 120 determines the difference between the calculated I and Q filter delays as denoted by step 224. As denoted by step 226, this difference then represents a difference to be applied in the signal processor 150 during normal operation, in order to align the delay effects of the I and Q channel filters in the model. Thus in normal operation, the I data signal and Q data signal are generated in accordance with known techniques, and then applied to the signal processor 150 which is controlled by the measurement and correlation block 120 to apply the appropriate delay in the signal processing block 150 in order to simulate the I and Q filter delay to align the envelope and RF paths in accordance with the determined difference in delays between such paths.

Preferably the delays associated with the respective I and Q channels are applied in the sub-processing blocks 151 and 153 for each channel. In the event the relative delay is determined, the one of the sub-processing blocks to which the delay is to be offset to align the delays is adjusted.

After signal processor 150, the processed I and Q signals are provided to block 152 which generates the envelope signal in accordance with standard techniques, and block 154 which provides further envelope processing before the envelope signal is delivered to the envelope filter 128a via delay block 124.

The linear processing provided by signal processor 150 is applied before the generation of the envelope signal in block 152, as the magnitude calculation for the envelope signal is a non-linear process.

Figure 4:
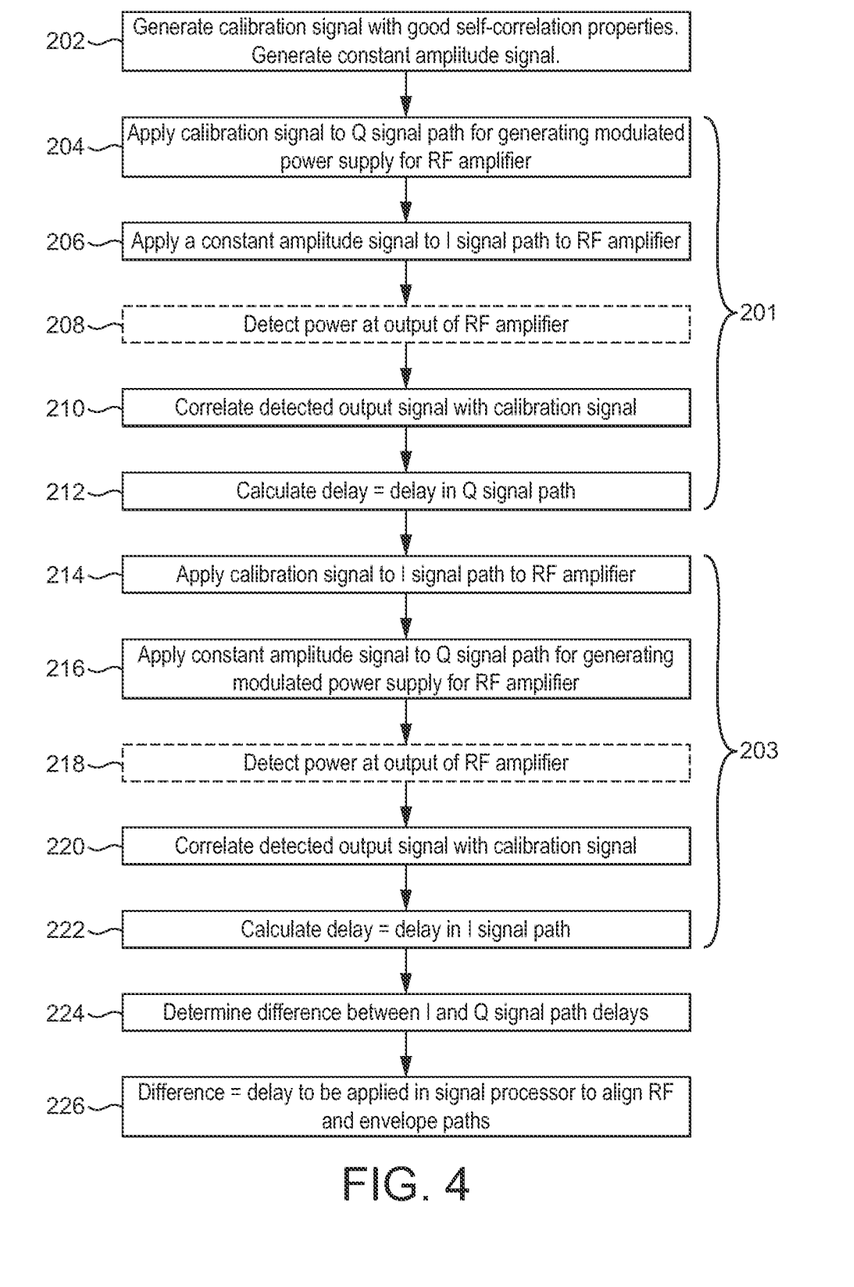
FIG. 4 illustrates a process flow in a first embodiment of the invention.

FIG. 4 sets out one example process by which a characteristic of the input path can be determined, particularly a relative delay characteristic of the I and Q filters. The signal processor 150 then implements that characteristic—in this example and I and Q filter relative delay—in the envelope path. In a particularly preferred implementation, all characteristics of the input path up to the input of the power amplifier 102 are determined, and applied in one or more signal processing blocks in the envelope path. In general, in embodiments a transfer function of one or more parts of the input path is determined, and the signal processor applies those one or more transfer functions in the envelope path.

The bandwidth of the signal applied to the RF path in either the first or second phases of the self-calibration technique must lie within the bandwidth of the envelope tracking system.

Since the delay information is determined using a relative measurement technique, the uncertainty of the bandwidth in the power detector is removed.

An alternative technique for providing the self-alignment in accordance with the invention is described with reference to FIG. 5. In this technique the calibration signal with good self-correlation properties is a sinusoidal signal, and phase detection (either in the analogue domain or the digital domain) is implemented in order to determine the delay. In this technique the phase shift around the loop is measured for each of the Q signal path and the I signal path, and then the difference in phase shift between the two paths used to calculate the delay difference between the two paths.

Figure 5:
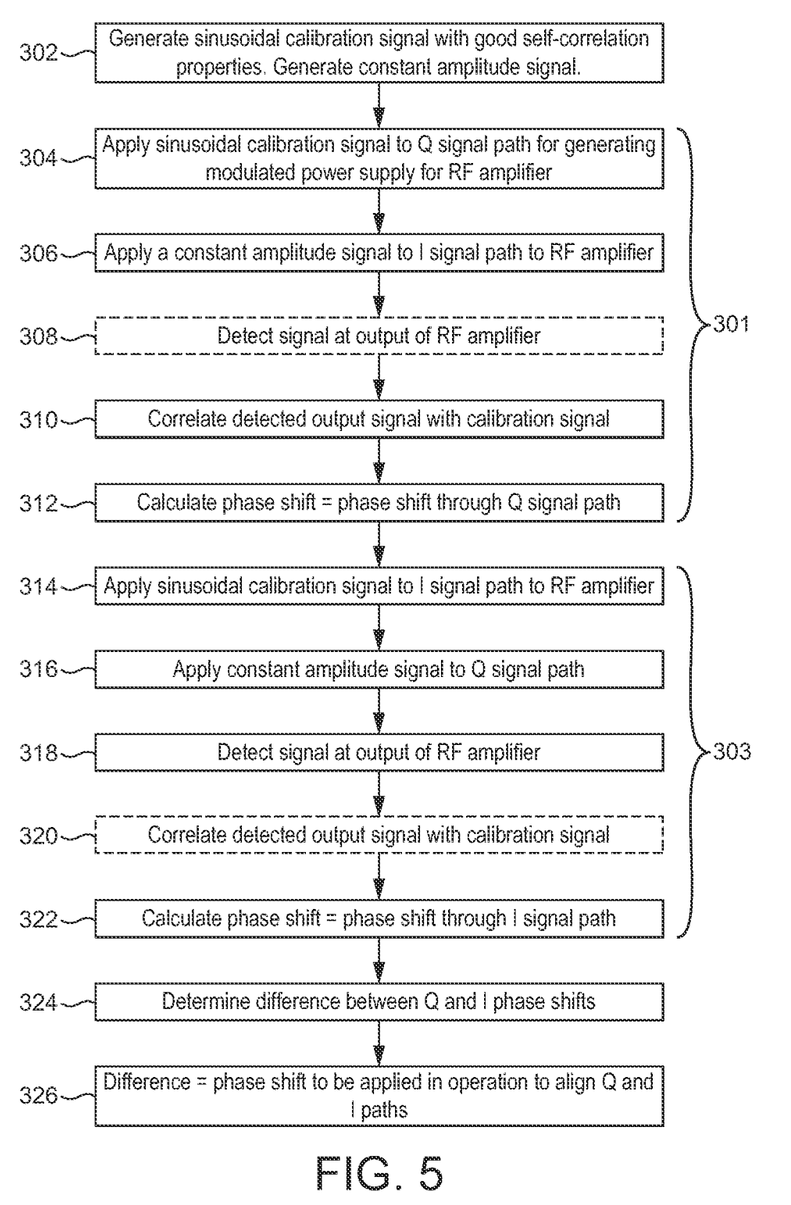
FIG. 5 illustrates a process flow in a second embodiment of the invention.

FIG. 5 illustrates a set of process steps corresponding to the process steps of FIG. 4, with steps labelled with reference numerals 3XX in FIG. 5 corresponding to elements labelled with reference numerals 2XX in FIG. 4.

As illustrated in the steps of FIG. 5, in step 302 a sinusoidal calibration signal is generated, and in steps 312 and 322 a phase shift is calculated as a result of the correlation. In step 324 a difference between the respective phase shifts is determined, to provide a phase shift to be applied by the signal processor in step 326.

An advantage offered by the invention is that it provides a technique of self-calibration for time alignment that is required for high bandwidth operation of an envelope tracking system using readily available and easy implemented functions. This mitigates the need for specific factory calibration.

The invention is described herein with reference to particular examples and embodiments, which are useful for understanding the invention and understanding a preferred implementation of the invention. The invention is not, however, limited to the specifics of any given embodiment, nor are the details of any embodiment mutually exclusive. The scope of the invention is defined by the appended claims.

What is claimed is:

1. A method of calibrating an envelope path and an input path of an amplification stage of an envelope tracking power supply, the method comprising matching the envelope path to at least one characteristic of at least one element of the input path.

2. The method of claim 1 wherein the step of matching the envelope path to at least one characteristic of at least one element of the input path comprises providing, in the envelope path, a replica of the at least one element.

3. The element of claim 2 wherein the input path includes a Q signal channel and an I signal channel, the step of matching comprising matching the envelope path to at least one characteristic of at least one element of the Q signal channel and matching the envelope path to at least one characteristic of at least one element of the I signal channel.

4. The method of claim 3 further comprising providing, in the envelope path, a replica of at least one element of the Q signal channel and a replica of at least one element of the I signal channel.

5. The method of claim 1 wherein at least one characteristic includes a delay characteristic.

6. The method of claim 5, wherein the step of matching comprises matching, in the envelope path, a delay characteristic of the Q signal channel and the I signal channel.

7. The method of claim 6 wherein the delay characteristic is the relative delay between the Q signal channel and the I signal channel.

8. The method of claim 7 further comprising:
a) applying a calibration signal to the Q signal path;
   applying a constant amplitude signal to the I signal path;
   detecting a signal at the output of the amplifier;
   correlating the detected signal and the calibration signal; and
   determining a delay in the Q signal path in dependence on the correlation;
b) applying a calibration signal to the I signal path;
   applying a constant amplitude signal to the Q signal path;
   detecting a signal at the output of the amplifier;
   correlating the detected signal and the calibration signal; and
   determining a delay in the I signal path in dependence on the correlation;
c) determining the difference between the Q and I signal path delays;
d) applying a delay in the envelope path corresponding to the determined difference to reduce the difference between the timing of the input path and envelope path.

9. A method according to claim 8 in which the set of steps a) are performed before or after the set of steps b).

10. The method of claim 8 wherein the calibration signal is a sinusoidal signal, and delay in either the Q signal path or the I signal path is determined by measurement of a phase difference between the detected output signal and the sinusoidal calibration signal.

11. The method of claim 1 wherein the characteristics of the input path are applied in the envelope path before generation of the envelope signal.

12. An amplification stage including an amplifier and an envelope tracking power supply having an input path and an envelope path, the amplification stage further including a signal processor in the envelope path adapted to match at least one characteristic of at least one element of the input path.

13. The amplification stage of claim 12 wherein the signal processor is adapted to provide a replica of the at least one element.

14. The amplification stage of claim 12 wherein the input path includes a Q signal channel and an I signal channel, the signal processor including a first processing stage for matching the envelope path to a characteristic of the Q signal channel and a second processing stage for matching the envelope path to a characteristic of the I signal channel.

15. The amplification stage of claim 14 wherein the first processing stage is adapted to provide a replica of the Q signal channel and the second processing stage is adapted to provide a replica of the I signal channel.

16. The amplification stage of claim 14 wherein one of the first or second processing stages is adjusted in dependence on a determination of a relative difference between the I signal channel and the Q signal channel.

17. The amplification stage of claim 12 further including an envelope detector for generating an envelope signal for the envelope path, the input to the envelope detector being provided by the signal processor.

18. An amplification stage according to claim 12 in which the characteristic is an impairment of at least one element of the input path.

* * * * *